(12) United States Patent
Masui et al.

(10) Patent No.: US 7,873,092 B2
(45) Date of Patent: Jan. 18, 2011

(54) LASER DIODE

(75) Inventors: Yuji Masui, Kanagawa (JP); Takahiro Arakida, Kanagawa (JP); Yoshinori Yamauchi, Tokyo (JP); Norihiko Yamaguchi, Kanagawa (JP); Rintaro Koda, Tokyo (JP); Tomoyuki Oki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/980,459

(22) Filed: Oct. 31, 2007

(65) Prior Publication Data

US 2008/0117947 A1    May 22, 2008

(30) Foreign Application Priority Data

Nov. 17, 2006    (JP)    ............................. 2006-311691

(51) Int. Cl.
*H01S 5/00*    (2006.01)
(52) U.S. Cl. .............. 372/50.21; 372/43.01; 372/46.01; 372/50.1; 372/50.124; 257/436; 257/E25.032; 257/E33.076; 257/E33.077
(58) Field of Classification Search .............. 372/50.21, 372/43.01, 46.01, 50.1, 50.124; 257/436, 257/E25.032, E33.076, E33.077
See application file for complete search history.

(56) References Cited

U.S. PATENT DOCUMENTS

| | | | | |
|---|---|---|---|---|
| 5,568,499 A * | 10/1996 | Lear | .......................... | 372/45.01 |
| 5,574,744 A * | 11/1996 | Gaw et al. | ................ | 372/50.21 |
| 5,974,071 A * | 10/1999 | Jiang et al. | ................ | 372/50.21 |
| 6,717,972 B2 * | 4/2004 | Steinle et al. | ............. | 372/50.21 |
| 6,816,527 B2 * | 11/2004 | Ueki | ........................ | 372/46.01 |
| 7,184,454 B2 * | 2/2007 | Guenter | .................... | 372/50.21 |
| 7,184,455 B2 * | 2/2007 | Guenter et al. | ........... | 372/50.21 |
| 7,277,463 B2 * | 10/2007 | Guenter et al. | ........... | 372/50.21 |
| 7,366,217 B2 * | 4/2008 | Guenter et al. | ........... | 372/50.21 |
| 2003/0021322 A1 * | 1/2003 | Steinle et al. | .................. | 372/50 |
| 2005/0041714 A1 * | 2/2005 | Kim | ............................. | 372/50 |
| 2005/0041715 A1 * | 2/2005 | Kim | ............................. | 372/50 |
| 2005/0201665 A1 * | 9/2005 | Manderscheid | .............. | 385/14 |
| 2005/0286584 A1 * | 12/2005 | Guenter et al. | ............. | 372/50.1 |

FOREIGN PATENT DOCUMENTS

| | | |
|---|---|---|
| JP | 05-121825 | 5/1993 |
| JP | 05-267639 | 10/1993 |
| JP | 10-135568 | 5/1998 |
| JP | 10-190147 | 7/1998 |
| JP | 2003-522421 | 7/2003 |

OTHER PUBLICATIONS

Japanese Office Action dated Jun. 30, 2008 for corresponding Japanese Application No. 2006-311691.
Japanese Office Action issued Jun. 2, 2009 for corresponding Japanese Application No. 2006-311691.

* cited by examiner

*Primary Examiner*—Minsun Harvey
*Assistant Examiner*—Yuanda Zhang
(74) *Attorney, Agent, or Firm*—Rader, Fishman & Grauer PLLC

(57) ABSTRACT

The present invention provides a laser diode realizing improved light detection precision. The laser diode includes a stack structure in which a first semiconductor layer of a first conduction type, an active layer, and a second semiconductor layer of a second conduction type are included in this order; a photodetection layer; and a plurality of light absorption layers provided on the corresponding position of antinodes or nodes of standing waves of light output from the active layer.

22 Claims, 6 Drawing Sheets

LASER DIODE

CROSS REFERENCE TO RELATED APPLICATIONS

The present invention contains subject matter related to Japanese Patent Application JP 2006-311691 filed in the Japanese Patent Office on Nov. 17, 2006, the entire contents of which being incorporated herein by reference.

BACKGROUND OF THE INVENTION

1. Field of the Invention

The present invention relates to a laser diode having a light detecting device and, more particularly, to a laser diode which can be suitably applied to uses requiring high-degree light detection precision.

2. Description of the Related Art

Hitherto, in a semiconductor light emitting device for a use with an optical fiber, an optical disk, and the like, a laser beam emitted from a laser diode is detected by a light-detecting mechanism as part of an object of making the light output level of the laser diode constant, which is assembled in the semiconductor light emitting device. The light detecting mechanism can include, for example, a reflector that branches part of a laser beam and a semiconductor photodetector that detects the branched laser beam. In the configuration, however, the number of parts increases and, moreover, an issue occurs such that the reflector and the semiconductor photodetector have to be disposed with high precision with respect to the laser diode. As one measure solving such an issue, the laser diode and the semiconductor photodetector are integrally formed.

However, when the laser diode and the semiconductor photodetector are formed integrally, there is the possibility that the semiconductor photodetector detects not only stimulated emission light to be detected but also spontaneous emission light. In such a case, the light output level of the laser diode measured on the basis of photocurrent obtained by conversion by the semiconductor photodetector includes an error only by the amount of spontaneous emission light. The spontaneous emission light changes according to temperature, operating current, and the like and makes the correlation between the laser beam and the photocurrent nonlinear. The method is also not suitable for uses requested to control the light output level with high precision.

Japanese Unexamined Patent Application Publication (Translation of PCT Application) (JP-T) No. 2003-522421 discloses a technique of providing one photodetection layer in a semiconductor photodetector in the position of an antinode of a standing wave in a laser beam to make stimulated emission light detected more easily than spontaneous emission light.

SUMMARY OF THE INVENTION

However, the antinodes and the nodes of standing waves appear in the cycles, each corresponding to the half of an oscillation wavelength $\lambda o$. Consequently, it is requested to make the photodetection layer extremely thin. For example, in the case where the oscillation wavelength $\lambda o$ is 850 nm, the wavelength in the semiconductor photodetector ($\lambda o/n$: n denotes the refractive index in the semiconductor photodetector) is about 250 nm, so that the antinode and the node exist every 125 nm. The thickness of the photodetection layer is about 100 nm at the maximum. Considering that the thickness of the photodetection layer is generally in the order of μm, with the technique of JP-T No. 2003-522421, it is difficult to convert a sufficient amount of the stimulated emission light to photocurrent by the semiconductor photodetector. It is not easy to improve light detection precision.

It is therefore desirable to provide a laser diode realizing improved light detection precision.

According to an embodiment of the invention, there is provided a semiconductor light emitting apparatus having: a stack structure in which a first semiconductor layer of a first conduction type, an active layer, and a second semiconductor layer of a second conduction type are included in this order; a photodetection layer; and a plurality of light absorption layers provided on antipodes or nodes of standing waves of light output from the active layer.

In the semiconductor light emitting apparatus of the embodiment of the invention, stimulated emission is repeated in the stack structure by light generated by the active layer. As a result, light having a predetermined wavelength is output from the stack structure. Part of the light output from the stack structure (active layer) enters the photodetection layer and the plurality of light absorption layers. The light output from the stack structure includes not only the stimulated emission light but also spontaneous emission light.

In the case where the light absorption layer is provided at the node of the standing wave of light output from the active layer, the light absorption layer absorbs mainly spontaneous emission light more than the stimulated emission light. Consequently, in the case where the light absorption layers are provided between the active layer and the photodetection layer, the spontaneous emission light included in the light output from the active layer is selectively absorbed by the light absorption layers before it reaches the photodetection layer, so that the percentage of the stimulated emission light included in the light reaching the first semiconductor layer increases. Therefore, the first semiconductor layer absorbs light having the higher percentage of the stimulated emission light. On the other hand, in the case where the light absorption layers are provided on the side opposite to the active layer, of the first semiconductor layer, the first semiconductor layer absorbs not only the stimulated emission light but also the spontaneous emission light, and converts the absorbed light to photocurrent. Consequently, the stimulated emission light is not selectively absorbed, but the spontaneous emission light in the light passed through the first semiconductor layer is selectively absorbed by each of the second absorption layers.

On the other hand, in the case where the light absorption layers are provided in the antinodes of the standing waves of the light output from the active layer, the light absorption layers mainly absorb the stimulated emission light more than the spontaneous emission light. Consequently, when the light absorption layers are provided between the active layer and the photodetection layer, the stimulated emission light included in the light output from the active layer is selectively absorbed by the light absorption layers before it reaches the photodetection layer. In this case, the light passing through the light absorption layers and reaching the photodetection layer includes much spontaneous emission light, so that the photodetection layer absorbs light having the higher percentage of the spontaneous emission light. On the other hand, in the case where the light absorption layers are provided on the side opposite to the active layer, of the first semiconductor layer, the photodetection layer absorbs not only the stimulated emission light but also the spontaneous emission light and converts the light to photocurrent. Therefore, the stimulated emission light is not selectively absorbed. The light absorption layers selectively absorb the stimulated emission light in light passed through the photodetection layer.

In any of the above-described cases, when the first and light absorption layers are made of the semiconductor doped with impurity of the first conduction type, the light absorbed by the first and light absorption layers is converted to heat. However, when the first and light absorption layers are made of the substantially non-doped semiconductor, the light absorbed by the first and light absorption layers is converted to photocurrent. The "substantially non-doped semiconductor" is a concept including semiconductor which is doped with no impurity of any of the first and second conduction types, and semiconductor doped with a small amount of impurity to the extent that absorbed light can be converted to photocurrent. The concept is applied to the entire specification.

When a pair of electrodes electrically connected to the light absorption layer made of the substantially non-doped semiconductor is provided in the case where the first or light absorption layer is made of the substantially non-doped semiconductor in any of the above-described cases, the photocurrent converted by the light absorption layer can be output the outside.

In the semiconductor light emitting apparatus of the embodiment of the invention, in addition to the photodetection layer, the plurality of light absorption layers are provided on the corresponding position of the antinodes or nodes of the standing waves of the light output from the active layer. Consequently, in the case where the light absorption layers are provided between the first semiconductor layer and the photodetection layer and in the nodes of the standing waves of the light output from the active layer and are made of substantially non-doped semiconductor, the spontaneous emission light can be detected in each of the light absorption layers, and light having the higher percentage of the stimulated emission light can be detected in the photodetection layer. By computing both of the detection data in an external circuit, the contribution of the spontaneous emission light is eliminated and the value of the photocurrent generated by the stimulated emission light can be calculated. Thus, the light detection precision improves.

In the case where the light absorption layers are provided between the first semiconductor layer and the photodetection layer and in the antinodes of the standing waves of the light output from the active layer and are made of substantially non-doped semiconductor, the stimulated emission light can be detected in each of the light absorption layers, and light having the higher percentage of the spontaneous emission light can be detected in the photodetection layer. By computing both of the detection data in an external circuit, the contribution of the spontaneous emission light is eliminated and the value of the photocurrent generated by the stimulated emission light can be calculated. Thus, the light detection precision improves.

In the case where the light absorption layers are provided between the first semiconductor layer and the photodetection layer and in the nodes of the standing waves of the light output from the active layer and are made of semiconductor doped with impurity of the first conduction type, the component of the spontaneous emission light can be eliminated in each of the light absorption layers before the light reaches the first light absorption layer. Since the light having the higher percentage of the stimulated emission light reaches the photodetection layer, the light having the higher percentage of the stimulated emission light can be detected by the photodetection layer. Thus, the light detection precision improves.

In the case where the light absorption layers are provided on the side opposite to the active layer, of the photodetection layer and in the nodes of the standing waves of the light output from the active layer and are made of substantially non-doped semiconductor, any light, which may be the stimulated emission light or the spontaneous emission light, enters the photodetection layer is detected in the photodetection layer, and the spontaneous emission light in the light passed through the photodetection layer can be selectively detected in each of the light absorption layers. By computing both of the detection data in an external circuit, the contribution of the spontaneous emission light is eliminated and the value of the photocurrent generated by the stimulated emission light can be calculated. Thus, the light detection precision improves.

In the case where the light absorption layers are provided on the side opposite to the active layer, of the photodetection layer and in the antinodes of the standing waves of the light output from the active layer and are made of substantially non-doped semiconductor, any light, which may be the stimulated emission light or the spontaneous emission light, enters the photodetection layer is detected in the photodetection layer, and the stimulated emission light in the light passed through the photodetection layer can be selectively detected in each of the light absorption layers. By computing both of the detection data in an external circuit, the contribution of the spontaneous emission light is eliminated and the value of the photocurrent generated by the stimulated emission light can be calculated. Thus, the light detection precision improves.

Other and further objects, features and advantages of the invention will appear more fully from the following description.

DETAILED DESCRIPTION OF THE PREFERRED EMBODIMENTS

Embodiments of the present invention will be described in detail hereinbelow with reference to the drawings.

First Embodiment

Figure 1:
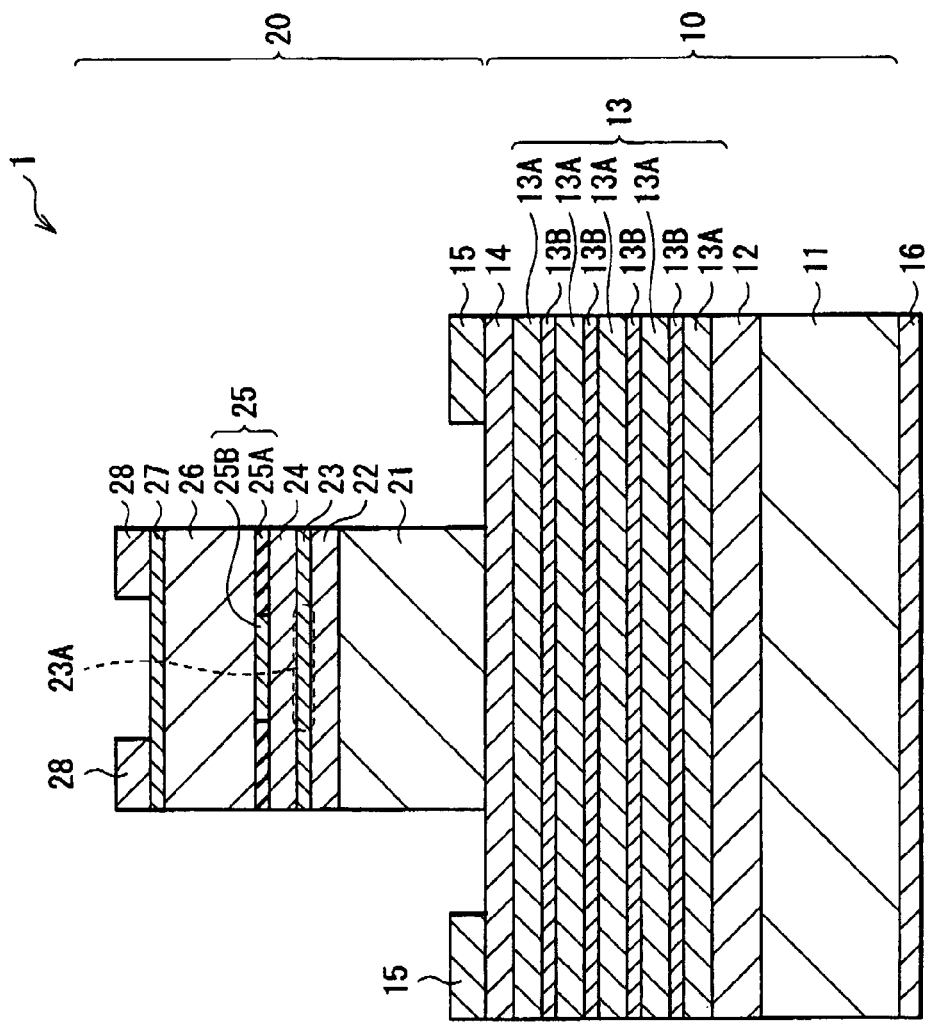
FIG. 1 is a sectional configuration diagram of a semiconductor light emitting device as a first embodiment of the invention.

FIG. 1 shows a sectional configuration of a laser diode 1 as a first embodiment of the present invention. The laser diode 1 is obtained by integrally forming a vertical-cavity surface-emitting laser 20 on a semiconductor photodetector 10.

In the laser diode 1, a laser beam of the vertical-cavity surface-emitting laser 20 is emitted from an n-side electrode 28 (which will be described later) to the outside. The laser beam is also leaked to the semiconductor photodetector 10 side. Photocurrent according to the output level of the laser beam leaked to the semiconductor photodetector 10 side is output from the semiconductor photodetector 10. That is, the laser diode 1 has a configuration that the semiconductor photodetector 10 is disposed on the side opposite to the side where the laser beam of the vertical-cavity surface-emitting laser 20 is emitted to the outside.

FIG. 1 shows a schematic configuration and dimensions and shapes are different from actual ones.

Vertical-Cavity Surface-Emitting Laser 20

In the vertical-cavity surface-emitting laser 20, a p-type DBR layer 21, a lower cladding layer 22, an active layer 23, an upper cladding layer 24, a current confinement layer 25, an n-type DBR layer 26, and an n-type contact layer 27 are stacked in order on the semiconductor photodetector 10.

The p-type DBR layer 21 is constructed by stacking a plurality of sets each made of a low-refractive-index layer (not shown) and a high-refractive-index layer (not shown). The low-refractive-index layer is, for example, a p-type $Al_{x1}Ga_{1-x1}As$ ($0<x1\leq1$) having a thickness of $\lambda o/4n_1$ ($\lambda o$ denotes the oscillation wavelength and $n_1$ denotes the refractive index), and the high-refractive-index layer is, for example, a p-type $Al_{x2}Ga_{1-x2}As$ ($0\leq x2<x1$) having a thickness of $\lambda o/4n_2$ ($n_2$ denotes the refractive index). Examples of p-type impurity are zinc (Zn), magnesium (Mg), and beryllium (Be).

The lower cladding layer 22 is made of, for example, $Al_{x3}Ga_{1-x3}As$ ($0\leq x3<1$). The active layer 23 is made of, for example, $Al_{x4}Ga_{1-x4}As$ ($0\leq x4\leq1$) and has a light emission area 23A in a region facing a current injection region 25B which will be described later. The upper cladding layer 24 is made of, for example, $Al_{x5}Ga_{1-x5}As$ ($0\leq x5\leq1$).

The current confinement layer 25 has a ring-shaped current confinement region 25A extending from a side face of the vertical-cavity surface-emitting laser 20 to a predetermined depth, and the other area is the current injection region 25B. The current injection region 25B is made of, for example, n-type $Al_{x6}Ga_{1-x6}As$ ($0<x6\leq1$). The current confinement layer 25A is made of a material containing $Al_2O_3$ (aluminum oxide) and, as will be described later, is obtained by oxidizing a current confinement layer 25D made of n-type $Al_{x6}Ga_{1-x6}As$ from the side face. Therefore, the current confinement layer 25 has the function of confining current. Examples of the n-type impurity are silicon (Si) and selenium (Se).

The n-type DBR layer 26 is constructed by stacking a plurality of sets each made of a low-refractive-index layer (not shown) and a high-refractive-index layer (not shown). The low-refractive-index layer is, for example, an n-type $Al_{x7}Ga_{1-x7}As$ ($0<x7\leq1$) having a thickness of $\lambda o/4n_3$ ($n_3$ denotes the refractive index), and the high-refractive-index layer is, for example, an n-type $Al_{x8}Ga_{1-x8}As$ ($0\leq x8<x7$) having a thickness of $\lambda o/4n_4$ ($n_4$ denotes the refractive index).

The n-type contact layer 27 is made of, for example, n-type GaAs. The vertical-cavity surface-emitting laser 20 also includes a ring-shaped n-side electrode 28 having an aperture in the center portion of the surface of the n-type contact layer 27. The n-side electrode 28 has a structure obtained by stacking an alloy of gold (Au) and germanium (Ge), nickel (Ni), and gold (Au) in order and is electrically connected to the n-type contact layer 27.

Semiconductor Photodetector 10

The semiconductor photodetector 10 is constructed by stacking a photodetection layer 12, a multilayer semiconductor layer 13, and a p-type contact layer 14 in order on an n-type semiconductor substrate 11.

The n-type semiconductor substrate 11 is made of, for example, n-type GaAs. The photodetection layer 12 is made of, for example, substantially non-doped GaAs. The photodetection layer 12 absorbs part of a laser beam output from the vertical-cavity surface-emitting laser 20 and converts the absorbed light to photocurrent. The photocurrent is input as a light output monitor signal to a light output computing circuit (not shown) connected to the semiconductor photodetector 10, and used for measuring the output level of a laser beam output from the vertical-cavity surface-emitting laser 20 in the light output computing circuit to the n-side electrode 28 (on the outside).

The multilayer semiconductor layer 13 is constructed by alternately stacking a light non-absorption layer 13A and a light absorption layer 13B, and the uppermost layer (the layer which is in contact with the p-type contact layer 14) is the light non-absorption layer 13A.

The light non-absorption layer 13A is made of a p-type semiconductor having a band gap larger than the energy corresponding to the oscillation wavelength $\lambda o$, and is provided in the antinode of the standing wave of the laser beam emitted from the vertical-cavity surface-emitting laser 20. Therefore, the light non-absorption layer 13A hardly absorbs both the stimulated emission light and the spontaneous emission light included in the laser beam emitted from the vertical-cavity surface-emitting laser 20. The light non-absorption layer 13A has the function of transmitting a laser beam without absorbing it.

The light absorption layer 13B is made of a p-type semiconductor having a band gap equal to or smaller than the energy corresponding to the oscillation wavelength $\lambda o$, and is provided in the position of a node of the standing wave of the vertical-cavity surface-emitting laser 20. Therefore, the light absorption layer 13B hardly absorbs the stimulated emission light included in the laser beam emitted from the vertical-cavity surface-emitting laser 20, but absorbs mainly the spontaneous emission light included in the laser beam. Since the absorbed spontaneous emission light is converted to heat, the light absorption layer 13B has the function of selectively eliminating the spontaneous emission light.

The spontaneous emission light absorption ratio (contrast ratio) of the light absorption layer 13B increases as the thickness of the light absorption layer 13B is reduced. However, when the thickness of the light absorption layer 13B is reduced excessively, the spontaneous emission light absorption amount decreases. It is therefore preferable to set the thickness of the light absorption layer 13B to a few tens nm. Since the contrast ratio of the light absorption layer 13B decreases as the thickness of the light absorption layer 13B increases, it is preferable to set the thickness of the light absorption layer 13B to $\lambda o/(4n_5)$ ($n_5$ denotes the refractive index of the light absorption layer 13B) or less.

In the case where the light non-absorption layer 13A and the light absorption layer 13B together with the p-type DBR layer 21 are made to function as a resonator mirror, that is, in the case where the multilayer semiconductor layer 13 is a part of the p-type DBR layer 21, preferably, the refractive index difference between the light non-absorption layer 13A and the light absorption layer 13B is made equal to the refractive index difference between the low-refractive-index layer and the high-refractive-index layer in the p-type DBR layer 21, and the thickness of the light non-absorption layer 13A and the thickness of the light absorption layer 13B are set to be equal to that of the low-refractive-index layer and that of the high-refractive-index layer, respectively.

In the case where the light non-absorption layer 13A and the light absorption layer 13B together with the p-type DBR layer 21 are not made to function as a resonator mirror, that is, in the case where the multilayer semiconductor layer 13 is provided separately from the resonator, to prevent an influence on a resonance mode by reflection at the interface between the light non-absorption layer 13A and the light absorption layer 13B, preferably, the refractive index difference between the light non-absorption layer 13A and the light absorption layer 13B is set to be small (larger than 0 and equal to or less than 0.1). For example, when the oscillation wavelength λo of the vertical-cavity surface-emitting laser 20 is 850 nm, the light non-absorption layer 13A is made of p-type $Al_{0.1}Ga_{0.9}As$ which does not absorb light having the wavelength of 850 nm, and the light absorption layer 13B is made of p-type GaAs which absorbs light having the wavelength of 850 nm. With the configuration, the refractive index difference between the light non-absorption layer 13A and the light absorption layer 13B can be set to about 0.1.

The p-type contact layer 14 is made of, for example, p-type $Al_{x9}Ga_{1-x9}As$ ($0 \leq x9 \leq 1$) and is electrically connected to the multilayer semiconductor layer 13. A p-side common electrode 15 is formed in a peripheral area in which the vertical-cavity surface-emitting laser 20 is not formed in the surface of the p-type contact layer 14. An n-side electrode 16 is formed on the back side of the n-type semiconductor substrate 11. The p-side common electrode 15 has a structure in which, for example, titanium (Ti), platinum (Pt), and gold (Au) are stacked in order, and is electrically connected to the p-type contact layer 14. The n-side electrode 16 has a structure in which, for example, AuGe, Ni, and Au are stacked in order from the n-type semiconductor substrate 11 side, and is electrically connected to the n-type semiconductor substrate 11.

The laser diode 1 having such a configuration can be manufactured as follows.

Figure 2:
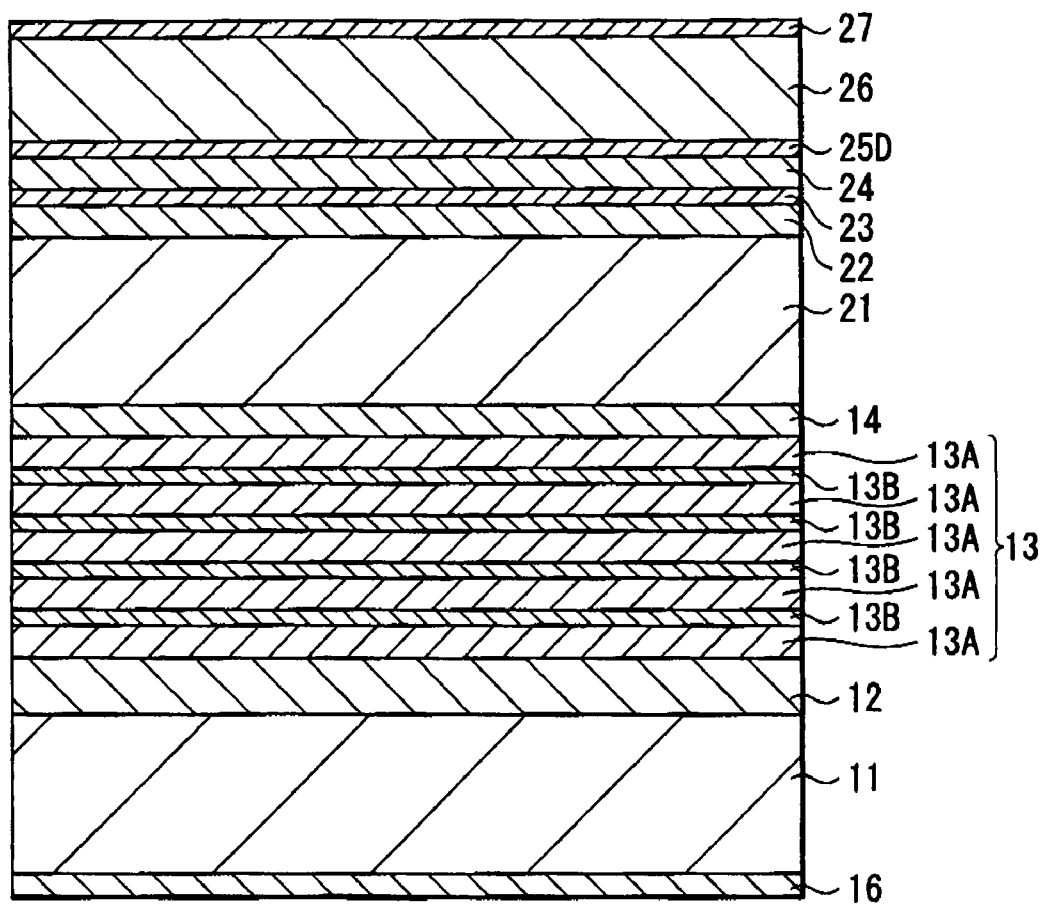
FIG. 2 is a cross section illustrating a manufacturing process of the semiconductor light emitting device of FIG. 1.
Figure 3:
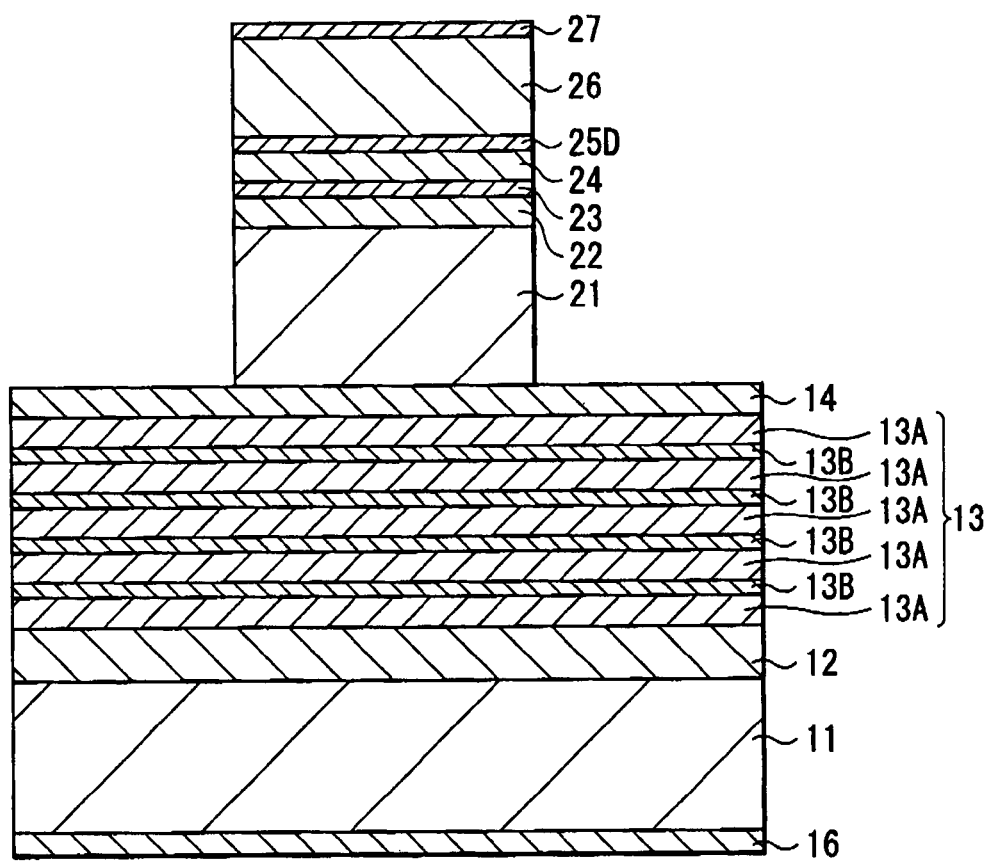
FIG. 3 is a cross section illustrating a process subsequent to FIG. 2.
Figure 4:
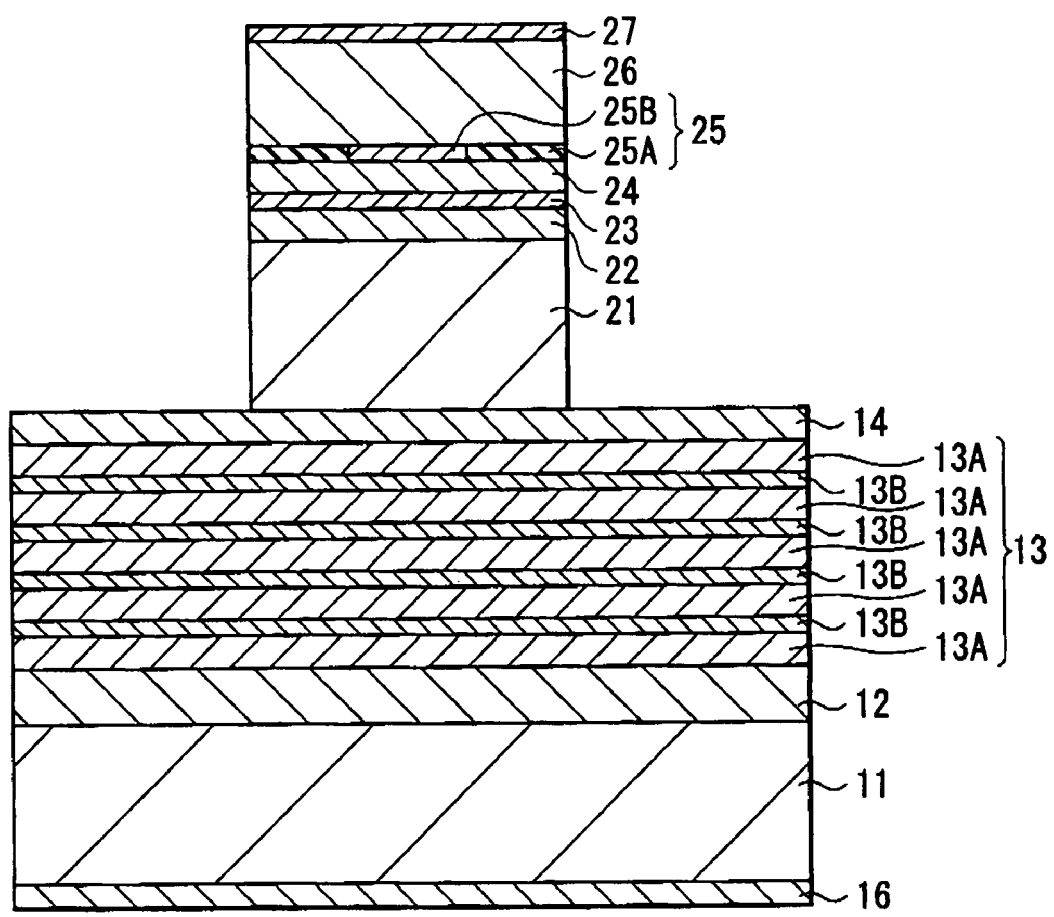
FIG. 4 is a cross section illustrating a process subsequent to FIG. 3.

FIGS. 2, 3, and 4 show the manufacturing method in the process order. To manufacture the laser diode 1, a semiconductor layer made of a GaAs-based compound semiconductor is formed by, for example, MOCVD (Metal Organic Chemical Vapor Deposition) on the entire surface of the n-type semiconductor substrate 11 made of n-type GaAs. As the material of the GaAS compound semiconductor, for example, trimethyl aluminum (TMA), trimethyl gallium (TMG), or arsine ($AsH_3$) is used. As the material of donor impurity, for example, hydrogen selenide ($H_2Se$) is used. As the material of acceptor impurity, for example, dimethyl zinc (DMZn) is used.

Concretely, first, the photodetection layer 12, the multilayer semiconductor layer 13, the p-type contact layer 14, the p-type DBR layer 21, the lower cladding layer 22, the active layer 23, the upper cladding layer 24, the current confinement layer 25, the n-type DBR layer 26, and the n-type contact layer 27 are stacked on the n-type semiconductor substrate 11 (FIG. 2).

Next, a mask (not shown) is formed in a predetermined region in the surface of the n-type contact layer 27 and the layers from the n-type contact layer 27 to the p-type DBR layer 21 are selectively etched by, for example, dry etching to form a mesa and, after that, the mask is removed (FIG. 3).

An oxidizing process is performed at high temperature in the vapor atmosphere to selectively oxidize the current confinement layer 25D from the side face. By the operation, the outer peripheral area of the current confinement layer 25D becomes an insulating layer (aluminum oxide). As a result, the ring-shaped current confinement region 25A is formed in the outer peripheral area, and the center area becomes the current injection region 25B. In such a manner, the current confinement layer 25 is formed (FIG. 4).

Next, the ring-shaped n-side electrode 28 is formed in the surface of the n-type contact layer 27 by the evaporation method. Similarly, the p-side common electrode 15 is formed in the exposed surface of the p-type contact layer 14, and the n-side electrode 16 is formed on the back side of the n-type semiconductor substrate 11 (FIG. 1). In such a manner, the laser diode 1 of the embodiment is manufactured.

The action and effect of the laser diode 1 of the embodiment will be described hereinbelow.

In the laser diode 1, when a predetermined voltage is applied across the p-side common electrode 15 and the n-side electrode 28, the current confined by the current confinement layer 25 is injected to the light emission area 23A as a gain area of the active layer 23. As a result, light is generated by recombination of electrons and holes. The light includes not only light generated by stimulated emission but also light generated by spontaneous emission. As a result of repetition of stimulated emission in the resonator, a laser oscillation occurs at a predetermined wavelength, and the light at the predetermined wavelength is output from the n-side electrode 28 side, and is also leaked to the semiconductor photodetector 10 side. The light output to the semiconductor photodetector 10 side enters the multilayer semiconductor layer 13, passes through the multilayer semiconductor layer 13, and enters the photodetection layer 12.

Since each of the light absorption layers 13B provided in the multilayer semiconductor layer 13 is provided at the node of a standing wave of the laser beam of the vertical-cavity surface-emitting laser 20, the light absorption layer 13B absorbs mainly the spontaneous emission light rather than the stimulated emission light. That is, the spontaneous emission light is selectively absorbed by each of the light absorption layers 13B and converted to heat. Before the laser beam reaches the photodetection layer 12, the component of the spontaneous emission light is reduced. Consequently, light having the higher percentage of the stimulated emission light reaches the photodetection layer 12, so that the light having the higher percentage of the stimulated emission light is absorbed by the photodetection layer 12 and is converted to photocurrent according to the output level of the absorbed light. The photocurrent is output as a light output monitor signal to a light output computing circuit via a wire (not shown) electrically connected to the p-side common electrode 15 and the n-side electrode 16. In such a manner, the output level of the laser beam output from the n-side electrode 28 to the outside is measured.

As described above, in the laser diode 1 of the embodiment, the plurality of light absorption layers 13B in which p-type impurity is doped are provided at nodes of the standing waves of the laser beam of the vertical-cavity surface-emitting laser 20 between the photodetection layer 12 and the active layer 23. Consequently, the component of the spontaneous emission light is reduced, and the light having the higher percentage of the stimulated emission light can be detected by the photodetection layer 12. The photocurrent converted by the semiconductor photodetector 10 is hardly influenced by the spontaneous emission light which changes according to the temperature, the operation current, and the like. The correlation between the laser beam output to the outside from the vertical-cavity surface-emitting laser 20 and the photocurrent output from the semiconductor photodetector 10 becomes almost linear, and the photodetection precision improves. As a result, the output level of the vertical-cavity surface-emitting laser 20 can be controlled with high precision.

Second Embodiment

Figure 5:
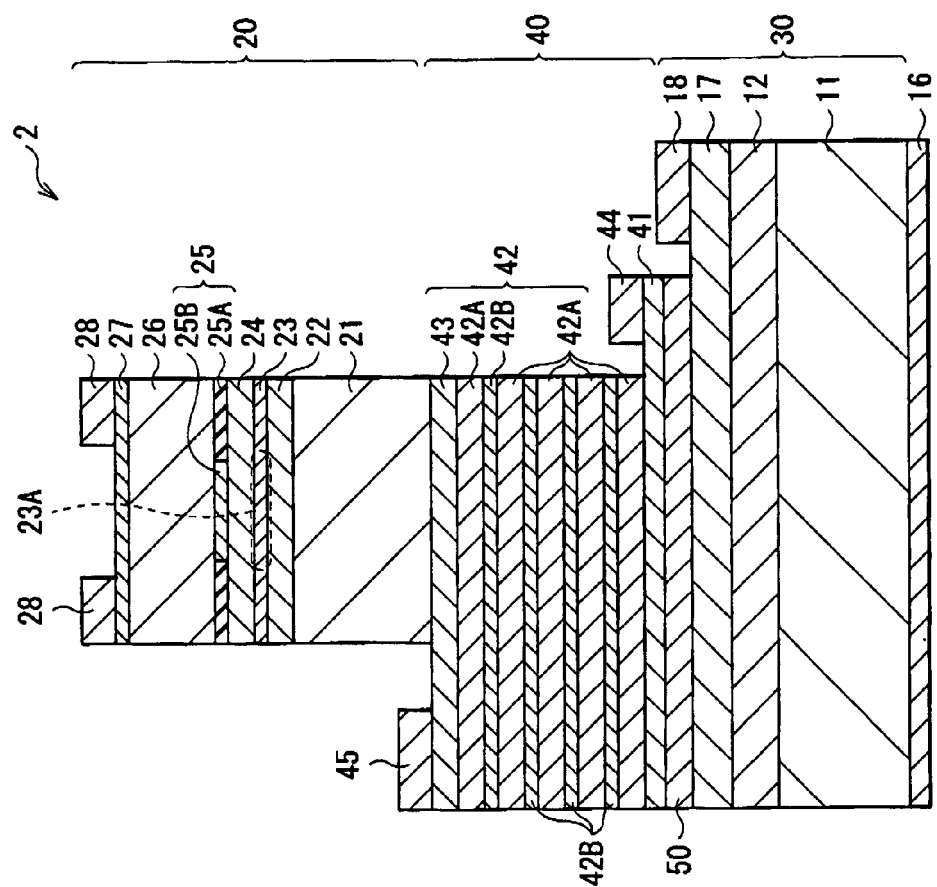
FIG. 5 is a sectional configuration diagram of a semiconductor light emitting device as a second embodiment of the present invention.

FIG. 5 shows a sectional configuration of a laser diode 2 as a second embodiment of the present invention. FIG. 5 is a schematic diagram and dimensions and shapes in FIG. 5 are different from actual ones. In the following description, when the same reference numeral as that in the foregoing embodiment is used, it means that the component has the configuration and function similar to those of the component having the same reference numeral.

The laser diode 2 is obtained by integrally forming a semiconductor photodetector 40, a device isolation layer 50, and a semiconductor photodetector 30 in order on the back side of the vertical-cavity surface-emitting laser 20. The laser diode 2 emits a laser beam of the vertical-cavity surface-emitting laser 20 from the n-side electrode 28 to the outside. The laser beam is also slightly leaked to the semiconductor photodetectors 30 and 40 side. Photocurrent according to the output level of the incident light is output from the semiconductor photodetectors 30 and 40.

That is, the laser diode 2 is mainly different from the laser diode 1 of the first embodiment having only one semiconductor photodetector with respect to the point that the laser diode 2 has two semiconductor photodetectors capable of outputting photocurrent. The different point will be mainly described in detail hereinbelow, and the description of the configurations, actions, and effects similar to those of the foregoing embodiment will not be repeated.

Semiconductor Photodetector 30

Like the semiconductor photodetector 10, the semiconductor photodetector 30 is provided to absorb a part of a laser beam emitted from the vertical-cavity surface-emitting laser 20 (concretely, light passed through the semiconductor photodetector 40) and convert the absorbed light to photocurrent. The semiconductor photodetector 30 is formed by stacking the photodetection layer 12 and a p-type semiconductor layer 17 in order on the n-type semiconductor substrate 11. A p-side electrode 18 is formed in a peripheral area where the semiconductor photodetector 40 is not formed in the surface of the p-type semiconductor layer 17. The n-side electrode 16 is formed on the back side of the n-type semiconductor substrate 11. The p-type semiconductor layer 17 is made of, for example, p-type GaAs. The p-side electrode 18 has a structure in which, for example, Ti, Pt, and Au are stacked in order, and is electrically connected to the p-type contact layer 14.

Device Isolation Layer 50

The device isolation layer 50 is provided to electrically isolate the semiconductor photodetectors 30 and 40 from each other and is made of, for example, non-doped GaAs.

Semiconductor Photodetector 40

The semiconductor photodetector 40 is constructed by stacking an n-type semiconductor layer 41, a multilayer semiconductor layer 42, and a p-type contact layer 43 in order on the device isolation layer 50 formed on the p-type semiconductor layer 17 of the semiconductor photodetector 30.

The n-type semiconductor layer 41 is made of, for example, n-type GaAs, and the p-type contact layer 43 is made of, for example, n-type GaAs. The multilayer semiconductor layer 42 is constructed by alternately stacking a light non-absorption layer 42A and a light absorption layer 42B, and the uppermost layer (the layer which is in contact with the p-type contact layer 43) is the light non-absorption layer 42A.

The light non-absorption layer 42A is made of a substantially non-doped semiconductor having a band gap larger than the energy corresponding to oscillation wavelength λo, and is provided in the antinode of the standing wave of the laser beam emitted from the vertical-cavity surface-emitting laser 20. Therefore, the light non-absorption layer 42A hardly absorbs both the stimulated emission light and the spontaneous emission light included in the laser beam emitted from the vertical-cavity surface-emitting laser 20. The light non-absorption layer 42A has the function of transmitting a laser beam without absorbing it.

The light absorption layer 42B is made of a substantially non-doped semiconductor having a band gap equal to or smaller than the energy corresponding to the oscillation wavelength λo, and is provided in the position of a node of the standing wave of the vertical-cavity surface-emitting laser 20. Therefore, the light absorption layer 42B hardly absorbs stimulated emission light included in the laser beam emitted from the vertical-cavity surface-emitting laser 20 but absorbs mainly spontaneous emission light included in the laser beam. The absorbed spontaneous emission light is converted to photocurrent. Consequently, the light absorption layer 42B has the function of selectively detecting the spontaneous emission light.

The spontaneous emission light absorption ratio (contrast ratio) of the light absorption layer 42B increases as the thickness of the light absorption layer 42B is reduced. However, when the thickness of the light absorption layer 42B is reduced excessively, the spontaneous emission light absorption amount decreases. It is therefore preferable to set the thickness of the light absorption layer 42B to a few tens nm. Since the contrast ratio of the light absorption layer 42B decreases as the thickness of the light absorption layer 42B increases, it is preferable to set the thickness of the light absorption layer 42B to $\lambda o/(4n_6)$ ($n_6$ denotes the refractive index of the light absorption layer 42B) or less.

In the case where the light non-absorption layer 42A and the light absorption layer 42B together with the p-type DBR layer 21 are made to function as a resonator mirror, that is, in the case where the multilayer semiconductor layer 42 is a part of the p-type DBR layer 21, preferably, the refractive index difference between the light non-absorption layer 42A and the light absorption layer 42B is made equal to the refractive index difference between the low-refractive-index layer and the high-refractive-index layer in the p-type DBR layer 21, and the thickness of the light non-absorption layer 42A and the thickness of the light absorption layer 42B are set to be equal to that of the low-refractive-index layer and that of the high-refractive-index layer, respectively.

In the case where the light non-absorption layer 42A and the light absorption layer 42B together with the p-type DBR layer 21 are not made to function as a resonator mirror, that is, in the case where the multilayer semiconductor layer 42 is provided separately from the resonator, to prevent an influence on a resonance mode by reflection at the interface between the light non-absorption layer 42A and the light absorption layer 42B, preferably, the refractive index difference between the light non-absorption layer 42A and the light absorption layer 42B is set to be small (larger than 0 and equal to or less than 0.1). For example, when the oscillation wavelength λo of the vertical-cavity surface-emitting laser 20 is 850 nm, the light non-absorption layer 42A is made of substantially non-doped $Al_{0.1}Ga_{0.9}As$ which does not absorb light having the wavelength of 850 nm, and the light absorption layer 42B is made of substantially non-doped GaAs which absorbs light having the wavelength of 850 nm. With the configuration, the refractive index difference between the light non-absorption layer 42A and the light absorption layer 42B can be set to about 0.1.

In the semiconductor photodetector 40, an n-side electrode is formed in a peripheral area where the multilayer semiconductor layer 42 is not formed in the surface of the n-type semiconductor layer 41, and a p-side electrode 45 is formed in a peripheral area where the vertical-cavity surface-emitting laser 20 is not formed in the p-type contact layer 43. The n-side electrode 44 has, for example, a structure obtained by stacking AuGe, Ni, and Au in order from the n-type semiconductor substrate 11 side, and is electrically connected to the n-type semiconductor layer 41. The p-side electrode 45 has, for example, a structure obtained by stacking Ti, Pt, and Au in order, and is electrically connected to the p-type contact layer 43.

In the laser diode 2 having such a configuration, when a predetermined voltage is applied across the p-side common electrode 45 and the n-side electrode 28, the current confined by the current confinement layer 25 is injected to the light emission area 23A as a gain area of the active layer 23. As a result, light is generated by recombination of electrons and holes. The light includes not only light generated by stimulated emission but also light generated by spontaneous emission. As a result of repetition of stimulated emission in the resonator, a laser oscillation occurs at a predetermined wavelength, and the light at the predetermined wavelength is output from the n-side electrode 28 side to the outside, and is leaked to the semiconductor photodetectors 30 and 40 side. The light output to the semiconductor photodetectors 30 and 40 side enters and passes through the semiconductor photodetector 40, and enters the semiconductor photodetector 30.

Since each of the light absorption layers 42B in the multilayer semiconductor layer 42 in the semiconductor photodetector 40 is provided at the node of a standing wave of the laser beam of the vertical-cavity surface-emitting laser 20, each of the light absorption layers 42B absorbs mainly the spontaneous emission light rather than the stimulated emission light. That is, the spontaneous emission light is selectively absorbed by each of the light absorption layers 42B and converted to photocurrent, so that, before the laser beam reaches the photodetection layer 12 in the semiconductor photodetector 30, the component of the spontaneous emission light is reduced. Consequently, light having the higher percentage of the stimulated emission light reaches the photodetection layer 12, so that the light having the higher percentage of the stimulated emission light is absorbed by the photodetection layer 12 and is converted to photocurrent according to the output level of the absorbed light. The photocurrent of the semiconductor photodetector 40 is output as a light output monitor signal to a light output computing circuit via a wire (not shown) electrically connected to the p-side electrode 45 and the n-side electrode 44. The photocurrent of the semiconductor photodetector 30 is output as a light output monitor signal to the light output computing circuit via a wire (not shown) electrically connected to the p-side electrode 18 and the n-side electrode 16. The light output computing circuit performs computation on the photocurrents, thereby obtaining the value of the photocurrent generated by the stimulated emission light by eliminating the contribution of the spontaneous emission light. For example, when the contribution of the stimulated emission light and the contribution of the spontaneous emission light in the photocurrent converted by the semiconductor photodetector 30 are L1 and S1, respectively, and the contribution of the stimulated emission light and the contribution of the spontaneous emission light in the photocurrent converted by the semiconductor photodetector 40 are L2 and S2, respectively, by subtracting a value which is S1/S2 times the photocurrent converted by the semiconductor photodetector 40 from the photocurrent converted by the semiconductor photodetector 30, the contribution of the spontaneous emission light can be eliminated from the photocurrent converted by the semiconductor photodetector 30. In such a manner, the output level of the laser beam output from the n-side electrode 28 side to the outside is measured.

As described above, in the laser diode 2 of the embodiment, the plurality of substantially non-doped light absorption layers 42B are provided at nodes of the standing waves of the laser beam of the vertical-cavity surface-emitting laser 20 between the photodetection layer 12 and the active layer 23. Consequently, the light having the higher percentage of the spontaneous emission light is detected by the light absorption layers 42B, the component of the spontaneous emission light is reduced, and the light having the higher percentage of the stimulated emission light can be detected by the photodetection layer 12. By computing the photocurrents converted by the semiconductor photodetectors 30 and 40 in the light output computing circuit, the value of the photocurrent generated by the stimulated emission light can be obtained. As a result, the photocurrent obtained by the light output computing circuit is not influenced by the spontaneous emission light that changes according to the temperature, the operation current, and the like. The correlation between the laser beam output to the outside from the vertical-cavity surface-emitting laser 20 and the photocurrent obtained by the light output computing circuit becomes linear, and the photodetection precision improves. As a result, the output level of the vertical-cavity surface-emitting laser 20 can be controlled with high precision.

Modification of Second Embodiment

Although the light absorption layers 42B are provided at the nodes of the standing waves in the foregoing embodiment, for example, the light absorption layers 42B may be provided in the antinodes of the standing waves. In this case, the stimulated emission light is selectively detected by the light absorption layers 42B and the light having the higher percentage of the spontaneous emission light can be detected in the photodetection layer 12. In such a manner, by computing both of the photocurrents in the light output computing circuit, the contribution of the spontaneous emission light is eliminated and the photocurrent generated by the stimulated emission light can be obtained. Thus, like the foregoing embodiment, the light detection precision improves, and the output level of the surface-emitting semiconductor layer 20 can be controlled with high precision.

Third Embodiment

Figure 6:
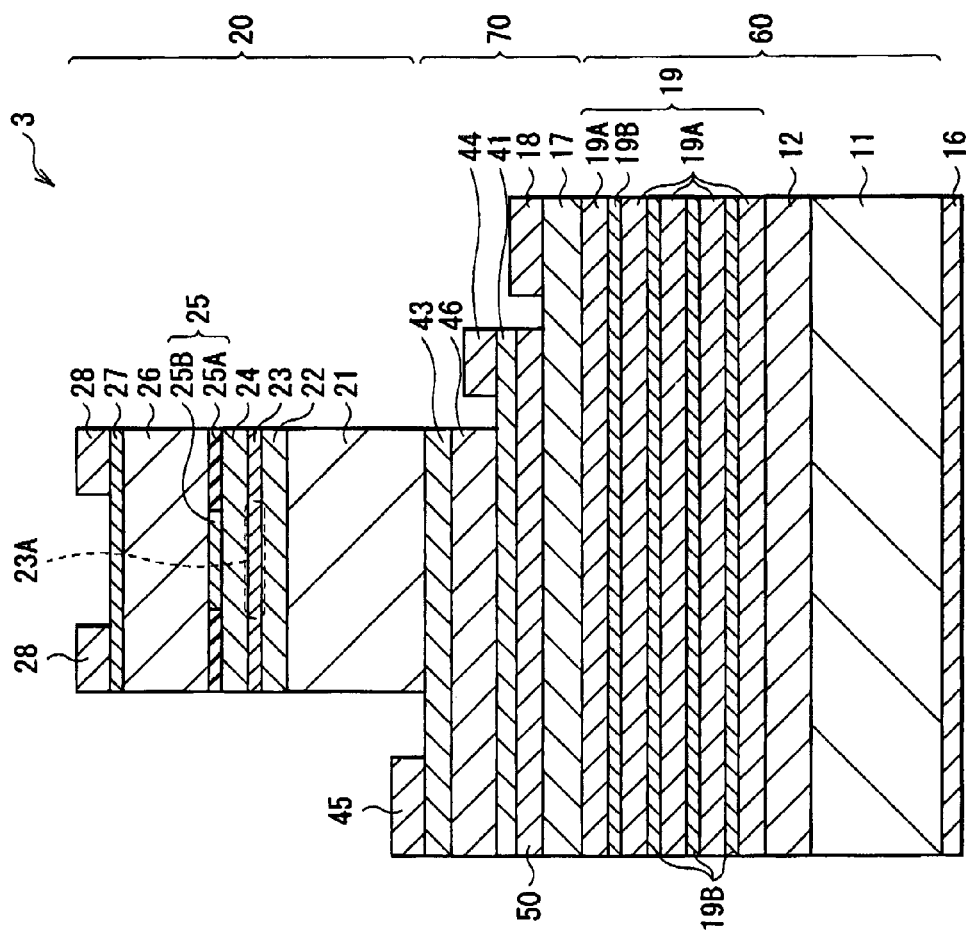
FIG. 6 is a sectional configuration diagram of a semiconductor light emitting device as a third embodiment of the present invention.

FIG. 6 shows a sectional configuration of a laser diode 3 as a third embodiment of the present invention. FIG. 6 is a schematic diagram, and dimensions and shapes in FIG. 6 are different from actual ones. In the following description, when the same reference numeral as that in the foregoing embodiments is used, it means that the component has the configuration and function similar to those of the component having the same reference numeral.

The laser diode 3 is obtained by integrally forming a semiconductor photodetector 70, the device isolation layer 50, and a semiconductor photodetector 60 in order on the back side of the vertical-cavity surface-emitting laser 20. The laser diode 3 emits a laser beam of the vertical-cavity surface-emitting laser 20 from the n-side electrode 28 side to the outside. The laser beam is also slightly leaked to the semiconductor photodetectors 60 and 70 side. Further, photocurrent according to the output level of the light enters the semiconductor photodetectors 60 and 70 is output from the semiconductor photodetectors 60 and 70.

That is, the laser diode 3 is common to the second embodiment with respect to the point that it has two semiconductor photodetectors capable of outputting photocurrent. The laser diode 3 is mainly different from that of the second embodiment with respect to the point that, as will be described later, the photodetection layer 46 is provided on the vertical-cavity surface-emitting laser 20 side more than the multilayer semiconductor layer 19 while the multilayer semiconductor layer 42 is provided on the vertical-cavity surface-emitting laser 20 side more than the photodetection layer 12 in the second embodiment. The different point will be mainly described in detail hereinbelow, and the description of the configurations, actions, and effects similar to those of the foregoing embodiment will not be repeated.

Semiconductor Photodetector 70

The semiconductor photodetector 70 is formed by stacking the n-type semiconductor layer 41, a photodetection layer 46, and the p-type semiconductor layer 43 in order on the device isolation layer 50.

The n-type semiconductor layer 41 is made of, for example, n-type GaAs. The photodetection layer 46 is made of, for example, substantially non-doped GaAs, absorbs a part of the laser beam output from the vertical-cavity surface-emitting laser 20, and converts the absorbed light to photocurrent. The p-type semiconductor layer 43 is made of, for example, p-type GaAS.

The n-side electrode 44 is formed in a peripheral area where the photodetection layer 46 is not formed in the surface of the n-type semiconductor layer 41. The p-side electrode 45 is formed in a peripheral area where the vertical-cavity surface-emitting laser 20 is not formed in the surface of the p-type semiconductor layer 43.

Device Isolation Layer 50

The device isolation layer 50 is provided to electrically isolate the semiconductor photodetectors 60 and 70 from each other and is made of, for example, non-doped GaAs.

Semiconductor Photodetector 60

The semiconductor photodetector 60 is constructed by stacking a multilayer semiconductor layer 19 and a p-type semiconductor layer 17 in order on the n-type semiconductor substrate 11.

The multilayer semiconductor layer 19 is constructed by alternately stacking a light non-absorption layer 19A and a light absorption layer 19B, and the uppermost layer (the layer which is in contact with the p-type semiconductor layer 17) is the light non-absorption layer 19A.

The light non-absorption layer 19A is made of a substantially non-doped semiconductor having a band gap larger than the energy corresponding to oscillation wavelength λo, and is provided in the antinode of the standing wave of the laser beam emitted from the vertical-cavity surface-emitting laser 20. Therefore, the light non-absorption layer 19A hardly absorbs both the stimulated emission light and the spontaneous emission light included in the laser beam emitted from the vertical-cavity surface-emitting laser 20. The light non-absorption layer 19A has the function of transmitting a laser beam without absorbing it.

The light absorption layer 19B is made of a substantially non-doped semiconductor having a band gap equal to or smaller than the energy corresponding to the oscillation wavelength λo, and is provided in the position of the node of the standing wave of the vertical-cavity surface-emitting laser 20. Therefore, the light absorption layer 19B hardly absorbs the stimulated emission light included in the laser beam emitted from the vertical-cavity surface-emitting laser 20 but absorbs mainly the spontaneous emission light included in the laser beam. The absorbed spontaneous emission light is converted to photocurrent. Consequently, the light absorption layer 19B has the function of selectively detecting the spontaneous emission light.

The spontaneous emission light absorption ratio (contrast ratio) of the light absorption layer 19B increases as the thickness of the light absorption layer 19B is reduced. However, when the thickness of the light absorption layer 19B is reduced excessively, the spontaneous emission light absorption amount decreases. It is therefore preferable to set the thickness of the light absorption layer 19B to a few tens nm. Since the contrast ratio of the light absorption layer 19B decreases as the thickness of the light absorption layer 19B increases, it is preferable to set the thickness of the light absorption layer 19B to $\lambda o/(4n_7)$ ($n_7$ denotes the refractive index of the light absorption layer 19B) or less.

In the case where the light non-absorption layer 19A and the light absorption layer 19B together with the p-type DBR layer 21 are made to function as a resonator mirror, preferably, the refractive index difference between the light non-absorption layer 19A and the light absorption layer 19B is made equal to the refractive index difference between the low-refractive-index layer and the high-refractive-index layer in the p-type DBR layer 21, and the thickness of the light non-absorption layer 19A and the thickness of the light absorption layer 19B are set to be equal to that of the low-refractive-index layer and that of the high-refractive-index layer, respectively.

In the case where the light non-absorption layer 19A and the light absorption layer 19B together with the p-type DBR layer 21 are not made to function as a resonator mirror, that is, in the case where the multilayer semiconductor layer 19 is provided separately from the resonator, to prevent an influence on a resonance mode by reflection at the interface between the light non-absorption layer 19A and the light absorption layer 19B, preferably, the refractive index difference between the light non-absorption layer 19A and the light absorption layer 19B is set to be small (larger than 0 and equal to or less than 0.1). For example, when the oscillation wavelength λo of the vertical-cavity surface-emitting laser 20 is 850 nm, the light non-absorption layer 19A is made of substantially non-doped $Al_{0.1}Ga_{0.9}As$ which does not absorb light having the wavelength of 850 nm, and the light absorption layer 19B is made of substantially non-doped GaAs which absorbs light having the wavelength of 850 nm. With the configuration, the refractive index difference between the light non-absorption layer 19A and the light absorption layer 19B can be set to about 0.1.

In the semiconductor photodetector 60, the p-side electrode 18 is formed in a peripheral area where the device isolation layer 50 is not formed in the surface of the p-type semiconductor layer 17, and the n-side electrode 16 is formed on the back side of the n-type semiconductor substrate 11.

In the laser diode 3 having such a configuration, when a predetermined voltage is applied across the p-side common electrode 45 and the n-side electrode 28, the current confined by the current confinement layer 25 is injected to the light emission area 23A as a gain area of the active layer 23. As a result, light is generated by recombination of electrons and holes. The light includes not only light generated by stimulated emission but also light generated by spontaneous emission. As a result of repetition of stimulated emission in the resonator, a laser oscillation occurs at a predetermined wavelength, and the light at the predetermined wavelength is output from the n-side electrode 28 side to the outside, and is leaked to the semiconductor photodetectors 60 and 70 side. The light output to the semiconductor photodetectors 60 and 70 side enters and passes through the semiconductor photodetector 70, and enters the semiconductor photodetector 60.

Since each of the light absorption layers 19B is provided on the side opposite to the active layer 23 of the photodetection layer 46, and the laser beam from the vertical-cavity surface-emitting laser 20 directly enters the photodetection layer 46. Consequently, the component of the spontaneous emission light is not eliminated before the laser beam reaches the photodetection layer 46. Therefore, the photodetection layer 46 absorbs not only the stimulated emission light but also the spontaneous emission light, and the light is converted to photocurrent. However, the light absorption layers 19B are provided at nodes of standing waves of the laser beam from the vertical-cavity surface-emitting laser 20, so that the light absorption layers 19B absorb mainly the spontaneous emission light more than the stimulated emission light. That is, in each of the light absorption layers 19B, the spontaneous emission light is selectively absorbed and converted to photocurrent. The photocurrent of the semiconductor photodetector 70 is output as a light output monitor signal to a light output computing circuit via a wire electrically connected to the p-side electrode 45 and the n-side electrode 44. The photocurrent of the semiconductor photodetector 60 is output as a light output monitor signal to the light output computing circuit via a wire electrically connected to the p-side electrode 18 and the n-side electrode 16. The light output computing circuit performs computation on the photocurrents, thereby obtaining the value of the photocurrent generated by the stimulated emission light by eliminating the contribution of the spontaneous emission light. For example, when the contribution of the stimulated emission light and the contribution of the spontaneous emission light in the photocurrent converted by the semiconductor photodetector 60 are L3 and S3, respectively, and the contribution of the stimulated emission light and the contribution of the spontaneous emission light in the photocurrent converted by the semiconductor photodetector 70 are L4 and S4, respectively, by subtracting a value which is S3/S4 times the photocurrent converted by the semiconductor photodetector 70 from the photocurrent converted by the semiconductor photodetector 60, the contribution of the spontaneous emission light can be eliminated from the photocurrent converted by the semiconductor photodetector 60. In such a manner, the output level of the laser beam output from the n-side electrode 28 to the outside is measured.

As described above, in the laser diode 3 of the third embodiment, the plurality of substantially non-doped light absorption layers 19B are provided at nodes of the standing waves of the laser beam of the vertical-cavity surface-emitting laser 20 on the side opposite to the active layer 23 of the photodetection layer 46. Consequently, the photodetection layer 46 detects a laser beam irrespective of the stimulation emission light and the spontaneous emission light, and each of the light absorption layer 19B can detect the light having the higher percentage of the spontaneous emission light. By computing the photocurrents converted by the semiconductor photodetectors 60 and 70 in the light output computing circuit, the value of the photocurrent generated by the stimulated emission light can be obtained. As a result, the photocurrent obtained by the light output computing circuit is not influenced by the spontaneous emission light that changes according to the temperature, the operation current, and the like. The correlation between the laser beam output to the outside from the vertical-cavity surface-emitting laser 20 and the photocurrent obtained by the light output computing circuit becomes linear, and the photodetection precision improves.

As a result, the output level of the vertical-cavity surface-emitting laser 20 can be controlled with high precision.

Modification of Third Embodiment

Although the light absorption layers 19B are provided at the nodes of the standing waves in the foregoing embodiment, for example, the light absorption layers 19B may be provided in the antinodes of the standing waves. In this case, the stimulated emission light can be selectively detected by the light absorption layers 19B. By computing both of the photocurrents in the light output computing circuit, the contribution of the spontaneous emission light is eliminated and the photocurrent generated by the stimulated emission light can be obtained. Thus, like the foregoing embodiment, the light detection precision improves, and the output level of the surface-emitting semiconductor layer 20 can be controlled with high precision.

Although the present invention has been described by the embodiments and modifications, the invention is not limited to the foregoing embodiments but can be variously modified.

For example, in the foregoing embodiments and the like, the case where a GaAs-based compound semiconductor is used as the semiconductor material has been described. The other materials, for example, a red material such as AlGaAs or GaInP, a blue material such as GaInN, or the like can be also used.

Although the semiconductor photodetectors 10, 30, 40, 60, and 70 are provided on the back side of the surface-emitting semiconductor layer 20 in the foregoing embodiments and the like, they may be provided on the side of outputting a laser beam to the outside. In this case, obviously, the light non-absorption layer 13A and the light absorption layer 13B, the light non-absorption layer 42A and the light absorption layer 42B, and the light non-absorption layer 19A and the light absorption layer 19B may be or may not be allowed to function as a part of the n-type DBR layer 26.

The case of using the n-type semiconductor substrate 11 as a common substrate has been described in the foregoing embodiments and the like. The present invention can be also applied to the case of using a p-type semiconductor substrate as the common substrate. In this case, it is sufficient to change the conduction types in the embodiments and the like from the p type to the n type and from the n type to the p type.

Obviously many modifications and variations of the present invention are possible in the light of the above teachings. It is therefore to be understood that within the scope of the appended claims the invention may be practiced otherwise than as specifically described.

What is claimed is:
1. A laser diode comprising:
a stack structure in which a first semiconductor layer of a first conduction type, a current confinement layer, an active layer, and a second semiconductor layer of a second conduction type are included in this order;
at least a first photodetection layer device and a second photodetection layer device;
wherein the first photodetection layer device has a first photodetection device contact layer of the second conduction type, a first photodetection layer device semiconductor layer of the first conduction type and a plurality of alternating light absorption layers and light non-absorption layers forming a multilayer semiconductor layer sandwiched between the first photodetection layer device contact layer and the first photodetection layer device semiconductor layer and the second photodetection layer device, absent of alternating light absorption layers and light non-absorption layers, has a device isolation layer, a second photodetection layer device photodetection layer and a second photodector layer device semiconductor layer of the second conduction type disposed between the device isolation layer and the second photodetection layer device photodetection layer with the first photodetection layer device disposed between the stack structure and the second photodetection layer device; and the plurality of light absorption layers provided on the corresponding position of antinodes or nodes of standing waves of light output from the active layer.

2. The laser diode according to claim 1, wherein the light absorption layers are made of semiconductor doped with an impurity of the first conduction type.

3. The laser diode according to claim 2, wherein the light absorption layers are provided at the node.

4. The laser diode according to claim 2, further comprising a pair of electrodes for outputting photocurrent from one of the first photodetection layer device and the second photodetection layer device.

5. The laser diode according to claim 1, wherein the light absorption layers are made of semiconductor doped with no impurity of any of the first and second conduction types, or semiconductor doped with an amount of impurity to the extent that absorbed light can be converted to photocurrent.

6. A laser diode comprising:
a stack structure in which a first semiconductor layer of a first conduction type, a current confinement layer, an active layer, and a second semiconductor layer of a second conduction type are included in this order;
at least a first photodetection layer device and a second photodetection layer device;
wherein the first photodetection layer device has a plurality of alternating light absorption layers and light non-absorption layers forming a multilayer semiconductor layer and a first photodetection layer device photodetector layer in facially-opposing contact with the multilayer semiconductor device and a second photodetection layer device, absent of alternating light absorption layers and light non-absorption layers, has a device isolation layer, a second photodector layer device photodetection layer and a second photodetector layer device semiconductor layer of the second conduction type disposed between the device isolation layer and the second photodetection layer device photodetection layer with the second photodetection layer device disposed between the stack structure and the first photodetection layer device; and the plurality of light absorption layers provided on the corresponding position of antinodes or nodes of standing waves of light output from the active layer.

7. The laser diode according to claim 1, wherein the light absorption layers are disposed between the active layer and the first photodetector layer device photodetector layer.

8. The laser diode according to claim 7, wherein the light absorption layers are made of semiconductor doped with no impurity of any of the first and second conduction types, or semiconductor doped with an amount of impurity to the extent that absorbed light can be converted to photocurrent.

9. The laser diode according to claim 1, wherein each of the light absorption layers is made of a material having a refractive index different from that of adjacent layers by a value which is larger than 0 and equal to or less than 0.1.

10. The laser diode according to claim 1, wherein the first and second photodetection layer devices construct a pair of multilayer mirrors.

11. The laser diode according to claim 1, wherein a combination of one of the light absorption layer, one light non-absorption layer and the second semiconductor layer of the second conduction type construct a resonator mirror.

12. The laser diode according to claim 11, wherein the first semiconductor layer and the light absorption layers have a periodic structure corresponding to wavelength of light output from the active layer.

13. The laser diode according to claim 1, wherein the current confinement layer includes a current injection region and a current confinement region surrounding the current injection region.

14. The laser diode according to claim 13, wherein the current injection region is fabricated from n-type $Al_{x6}Ga_{1-x6}As$ where x6 is greater than 0 and less than or equal to 1.

15. The laser diode according to claim 14, wherein the current confinement region is fabricated from a material containing $Al_2O_3$.

16. The laser diode according to claim 13, wherein the current injection region is centrally disposed within the current confinement region.

17. The laser diode according to claim 1, wherein the current confinement layer is operative to confine current.

18. The laser diode according to claim 1, wherein the stack structure includes an upper cladding layer with the upper cladding layer being disposed between and in facial contact with the current confinement layer and the second semiconductor layer.

19. The laser diode according to claim 1, wherein the light absorption layers are provided between the active layer and the first photodetector layer device photodetection layer.

20. The laser diode according to claim 6, wherein the light absorption layers are provided between the second photodetector layer device semiconductor layer and the first photodetection layer device photodetection layer.

21. The laser diode according to claim 6, wherein the light absorption layers are made of semiconductor doped with an impurity of the first conduction type.

22. The laser diode according to claim 6, further comprising a pair of electrodes for outputting photocurrent from one of the first photodetection layer device and the second photodetection layer device.

* * * * *